(12) United States Patent
Reeves

(10) Patent No.: US 6,226,755 B1
(45) Date of Patent: May 1, 2001

(54) APPARATUS AND METHOD FOR ENHANCING DATA TRANSFER TO OR FROM A SDRAM SYSTEM

(75) Inventor: Earl C. Reeves, Tomball, TX (US)

(73) Assignee: Compaq Computer Corp., Houston, TX (US)

(*) Notice: Subject to any disclaimer, the term of this patent is extended or adjusted under 35 U.S.C. 154(b) by 0 days.

(21) Appl. No.: 09/236,871

(22) Filed: Jan. 26, 1999

(51) Int. Cl.[7] .................................................. G06F 1/04
(52) U.S. Cl. ............................................. 713/400; 713/600
(58) Field of Search ................................. 713/400, 500, 713/600; 711/105, 106, 167

(56) References Cited

U.S. PATENT DOCUMENTS

| | | |
|---|---|---|
| 4,207,618 | 6/1980 | White, Jr. et al. |
| 5,345,577 | 9/1994 | Chan et al. |
| 5,446,696 | 8/1995 | Ware et al. |
| 5,684,978 * | 11/1997 | Sarma et al. ........................... 395/496 |
| 5,802,597 * | 9/1998 | Nelsen ................................... 711/169 |
| 6,078,986 * | 6/2000 | Uchiyama et al. .................... 711/105 |
| 6,141,765 * | 10/2000 | Sherman ............................... 713/400 |

* cited by examiner

Primary Examiner—Dennis M. Butler
(74) Attorney, Agent, or Firm—Kevin L. Daffer; Conley, Rose & Tayon

(57) ABSTRACT

A computer system, bus interface unit employing a memory controller, and method are presented for optimizing the bandwidth data, address, and control transfer rates across a memory bus coupled to an SDRAM system. The SDRAM system is partitioned such that one partition will undergo pre-charge or refresh in the interim between times in which another partition (or a pair of partitions) initiate a burst read. The burst read cycles coincide with an initial column address of the burst, and are spaced a number of cycles equal to the burst length. Proper spacing of the initial column address, or read request, relative to a non-read requested partition ensures data read from the activated partition will be placed on the memory data bus in seamless fashion. That is, there are no non-data transfers occurring between data burst cycles, even though refresh or pre-charge operations are performed on a non-read partition. Careful placement of the hidden refresh cycles encountered by one partition relative to read cycles on other partitions ensures the data flow resulting therefrom will be optimized to sustain peak bandwidth on a synchronous DRAM memory bus.

20 Claims, 4 Drawing Sheets

APPARATUS AND METHOD FOR ENHANCING DATA TRANSFER TO OR FROM A SDRAM SYSTEM

BACKGROUND OF THE INVENTION

1. Field of the Invention

This invention relates to computer system and, more particularly, to a system and method for maximizing data transfer efficiency across a memory bus employing synchronous dynamic random access memory ("SDRAM").

2. Description of the Related Art

A dynamic random access memory ("DRAM") device is generally well-known as containing an array of memory elements organized within rows and columns. A read or write access begins by transmitting a row address on the address bus and asserting the RAS control signal to latch the address to an appropriate row within the DRAM. The RAS control signal must be maintained, while the column address is transmitted on the multiplexed address bus and the CAS control signal is asserted. Strobing the CAS control signal will select the desired data word to be sensed from the addressed row. This word can then be transmitted back to the processor or direct memory access ("DMA") device via a memory controller, in the case of a read access. In instances of write access, the information on the data bus is written into the column amplifiers and the modified row is restored within the memory array.

An important requirement of DRAM technology is that the RAS control signal must be maintained during the time in which access is desired. If a burst of data is to be read, then the amount of time at which the RAS control signal is maintained asserted is limited by the need to periodically pre-charge the row being read. An improved memory architecture, known as synchronous DRAM ("SDRAM"), minimizes the need to maintain assertion of the RAS control signal during a read access. SDRAM merely requires pulsing of the RAS control signal only for the set-up and hold times relative to a particular clock edge. The row being addressed by the pulsed RAS control signal will remain active until a deactivate command is given. In addition to the benefits of merely strobing a RAS control signal and therefore maximizing pre-charge time, the SDRAM architecture beneficially synchronizes its commands to the memory bus clock, which is derived as a ratio of the processor clock. Thus, an SDRAM operation is said to be synchronized with the clock which operates the processor or central processing unit ("CPU").

The various commands, such as RAS, CAS, activate, and deactivate, are given on a rising edge of the system clock. The deactivate command initiates the pre-charge operation of the previously accessed row, whereby voltage upon the memory elements being read is restored from the latched values on the corresponding column amplifiers. The pre-charge operation thereby serves to restore charge on the read capacitors occurring during a sense operation. Over time, however, the pre-charge operation will not be sufficient to replace charge which "leaks" from the storage capacitor. The storage cell and, more particularly, capacitors within respective cells must therefore be periodically refreshed. Typically there is a maximum time over which every cell must be read and then written back (i.e., refreshed) to guarantee proper data retention. As such, the refresh operation of an SDRAM must be monitored so that each cell is timely recharged, either through a self-refresh technique or a CAS-before-RAS ("CBR") refresh technique, for example. Regardless of the refresh technique chosen, the refresh mechanism generally employs a counter which moves through rows of the array during each count cycle, refreshing charge from corresponding column amplifiers in its wake. Because each SDRAM integrated circuit or chip is typically divided into internal, or logical banks, read and write operations associated with each row refresh must be performed on each bank.

All data for the SDRAM device is generally written or read in burst fashion. Given a row address and an initial column address, the SDRAM internally accesses a sequence of locations beginning at the initial column address and proceeding to succeeding column addresses depending on the programmed length of the burst sequence. The sequence can be programmed to follow either a serial-burst sequence within one of the internal banks or an interleaved-burst sequence among the pair of internal banks. Conventional SDRAMs can be programmed to read or write a burst of one, two, four, eight, or more bits.

Reading N-bits of data during a read burst operation beneficially reduces the control signal overhead needed to transfer that burst of data across the system memory bus and to the memory requester. An additional benefit would be gained if several SDRAM chips can be grouped together and selected from a common chip select signal. For example, the SDRAM system can be partitioned and each partition may contain at least one SDRAM chip. If multiple SDRAMs are implemented in a single partition, then that partition can be interconnected on a printed circuit board, often denoted as a memory module, DIMM or SIMM. The chip select signal is thereby used to select a single partition among many partitions, each partition containing one or more SDRAM chips.

A benefit would be gained if the SDRAM system employs a relatively wide memory bus, possibly one which can transfer an entire cache line of 256 bits during a four system clock cycle—assuming a 64-bit wide single clock cycle transfer. However, it is contemplated that an entire cache line could be transferred if the memory bus is to exceed 64 bits in width, i.e., the memory bus is an entire cache line in width. Such a bus transfer architecture could be achieved by configuring each partition with a DIMM. In this fashion, a partition could transfer four quadwords from, for example, a 64 data pin DIMMs during each clocking cycle of the system clock. Transferring an entire cache line would prove especially useful when fetching a cache line of data to the processor cache, or when performing cache-line direct memory access ("DMA") transfers.

However, to take full advantage of any transfer efficiency upon the memory bus, the pre-charge and refresh operations must be accounted for and, more particularly, must be "hidden" from cycles present on the memory bus. An improved transfer technique must therefore be employed to ensure data transfers are not broken whenever a portion of the SDRAM system is being pre-charged or refreshed. In this manner, the cache lines of data are seamlessly forwarded on each clocking signal cycle for optimum memory bus bandwidth.

SUMMARY OF THE INVENTION

The problems outlined above are in large part solved by an improved memory bus transfer technique hereof. The present transfer technique is one which can perform three of more consecutive and unbroken fetches of cache line data from the memory to a requesting device. The requesting device can be either the processor or a peripheral performing access through a DMA cycle. The three consecutive fetches incur a data transfer that occupies no more than 12 system clock cycles, given a burst length of four cycles per burst.

The fetched data arise from partitions within the SDRAM system. Those partitions may include a minimum of one SDRAM chip. If an entire cache line is desired to be transferred within a single system clock cycle, then the partition being read includes a plurality of SDRAM chips commonly connected through a chip select signal. The partitioned group of chips can be arranged on a separate printed circuit board, such as that attributed to a DIMM.

During the time in which one partition is being read (i.e., data being transferred therefrom), another partition may undergo a refresh or pre-charge operation. However, the refresh or pre-charge operations which occur within any given partition do not occur consecutively between read requests attributed to another partition or another pair of partitions. In other words, the present transfer technique ensures the refresh and pre-fetch operations of one partition be separated in time by a read request attributed to another partition. In the example in which three partitions are used, the present transfer technique purposely interposes a read request to a second partition between a pre-charge and refresh operations associated with a third partition. In this fashion, a read request to a first partition can initiate data transfer of N burst cycles (where N is preferably four or more), followed immediately by data burst cycles attributed to the second partition read request, even though a pre-charge or refresh operation may occur on the third partition in the interim.

Enhancements to the data transfer bandwidth across the system memory bus appears "seamless", in that every system clock cycle performs a data transfer between the time in which the first data transfer cycle from the first partition begins, through the data transfer of the second partition and culminating with the last data transfer of the first partition, even through refresh or pre-charge conditions exist within the third partition. The example of using three partitions within the SDRAM system is merely an example, and is used only to illustrate a particular instance in which overall data transfer is improved. It is understood, however, that other partition examples for transfers among those partitions can be employed to increase data transfer provided the partition not participating in data transfers undergoes non-consecutive refresh and pre-charge, with a read request of another transfer interspersed therebetween, and the read request of one partition be spaced from the read request of another partition by the data burst length.

According to one embodiment, a computer system is provided. The computer system comprises a partitioned SDRAM system operably coupled to, for example, a display. A first one of the partitions may be adapted to receive a read request N number of cycles after a second one of the partitions receives a read request for dispatching N cycles of data to the display. A third one of the partitions initiates and concludes a refresh operation between the time in which the first and second ones of the partitions receives corresponding read requests. The refresh operation therefore begins and ends during the N cycles of the system clock which separate the read request on the second partition and the read request on the first partition. The partitions can comprise at least one SDRAM chip, wherein a grouping of SDRAM chips comprises a DIMM. Activating the chip select signal among the chips of a partition will activate at least one internal bank among each of those chips consistent with the read request accepted by those chips.

According to another embodiment, a synchronous DRAM system is provided. The SDRAM system includes a clocking circuit coupled to produce a sequence of clocking cycles upon the memory bus and initiated from the processor. The clocking circuit forwards the clocking cycles to a first, second, and third set of SDRAM integrated circuits grouped into respective partitions. The first set of SDRAM chips is coupled to read a data burst of N clock cycles initiated from a first read request. The second set of SDRAM chips is coupled to read a data burst of N clock cycles initiated from a second read request that occurs N clock cycles after the first read request. The first set of SDRAM chips is further coupled to read a data burst of N clock cycles initiated from a third read request that occurs N clock cycles after the second read request. A third set of SDRAM chips is coupled to initiate and culminate a sequence of refresh cycles in the interim between the second read request and the first read request.

According to yet another embodiment, a method is provided for transferring data from an SDRAM system. The method includes providing a plurality of successive clocking cycles to a first, second, and third partition of the SDRAM system. A first burst of data is transferred from the first partition. Immediately following transferal of the first burst of data, and absent any intervening clocking cycles, a second burst of data is transferred from the second partition. While a portion of the third partition undergoes a refresh operation, a third burst of data is transferred from the first partition immediately after transferring the second burst of data and absent any clocking cycles in the interim between transferring the second burst of data and the third burst of data.

BRIEF DESCRIPTION OF THE DRAWINGS

Other objects and advantages of the invention will become apparent upon reading the following detailed description and upon reference to the accompanying drawings in which.

Figure 1:
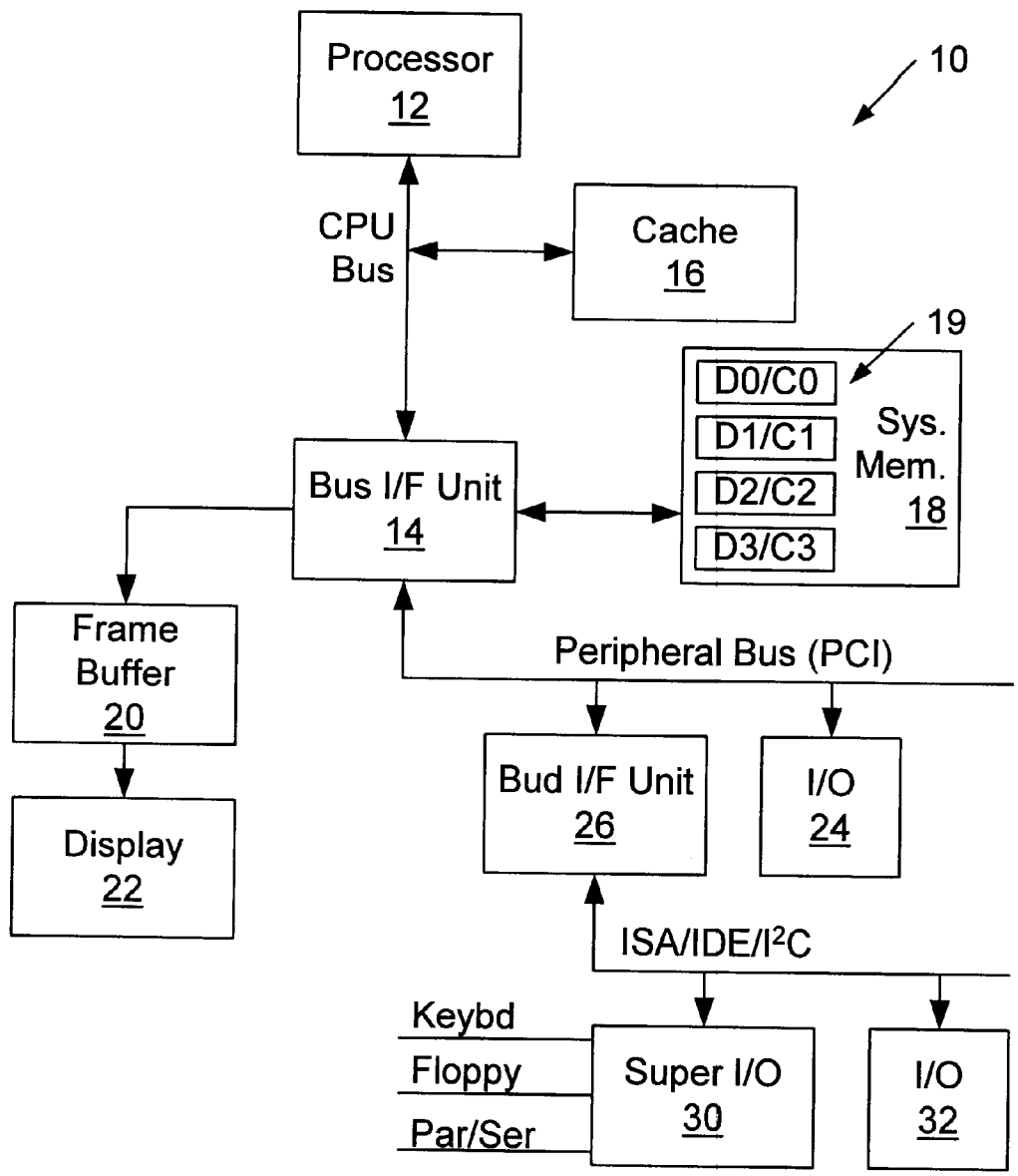
FIG. 1 is a block diagram of a computer system comprising various buses and bus interface units.

While the invention may be modified and have alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning to the drawings, FIG. 1 illustrates a computer 10 having multiple buses, including a CPU bus, a mezzanine or PCI bus, and multiple peripheral buses. In the example shown, the peripheral buses include an ISA bus, an IDE bus and a $I^2C$ bus. The CPU bus connects a CPU, or processor 12, to a bus interface unit or northbridge 14. A cache memory 16 can be embodied within or external to CPU 12.

Northbridge 14 provides an interface between components clocked at dissimilar rates. According to one embodiment, northbridge 14 interfaces a slower PCI bus and a faster CPU bus. Northbridge 14 may also contain a memory controller which allows communication to and from system memory 18. A suitable system memory 18 comprises SDRAM arranged in partitions. Four partitions 19 are shown, however, it is noted that at least three partitions are needed and more than four partitions may be employed. Each partition may include at least one chip, wherein a plurality of chips, labeled "C", may be interconnected by a chip select signal to form a DIMM, labeled "D".

Northbridge 14 may also include graphics support to allow communication to a graphics accelerator and buffer 20. A graphics support, included within an advanced graphics port such as the Accelerated Graphics Port (AGP), provides a high performance, component level interconnect targeted at three dimensional graphics display applications and is based on performance extensions or enhancements to PCI.

AGP interfaces are generally standard in the industry, the description of which is available from Intel Corporation. Generally speaking, AGP is physically, logically, and electrically independent of the PCI bus and is intended for the exclusive use of a display device 22. Display 22 is any electronic display upon which an image or text can be presented. A suitable display 22 includes a cathode ray tube (CRT), a liquid crystal display (LCD), etc.

Northbridge 14 is generally considered an application specific chip set, or application specific integrated circuit (ASIC) that provides connectivity to various buses, and integrates other system functions such as memory interface and P1394. System memory 18 is considered the main memory and refers to a portion of addressable memory that the majority of memory accesses target. System memory 18 is considered the largest continuous memory space of computer 10.

Northbridge 14 contains various sub-components, some of which serve as an interface to processor 12, system memory 18 and the graphics accelerator or frame buffer associated with display 22. A PCI interface is also included within northbridge 14 to allow accesses to and from input/output (I/O) devices 24 connected to the PCI bus.

Also connected to the PCI bus is a southbridge 26. Southbridge 26, similar to northbridge 14, includes various interfaces or controllers connected to respective buses. In the example shown, a controller or interface exists within southbridge 26 to handle communication between devices on the PCI bus, the IDE bus, the ISA bus and the I²C bus. The controllers, or interface units, serve to adapt transfer protocols from one bus to that of another. The interfaces also provide buffers to handle what could be substantially dissimilar transfer rates between buses.

Associated with each bus is a hardware resource. For example, an IDE bus includes peripheral devices, a popular such device being an IDE hard disk drive. Of course, numerous other peripheral devices may be connected to the IDE bus, and thereby granted access to computer system 10. In the example shown, an ISA bus is also connected to southbridge 26. According to known terminology, various controllers of multiple ISA type devices can be embodied upon a single monolithic substrate, deemed a super I/O 30. For example, a floppy drive, a keyboard, and a serial/parallel port may be coupled to the ISA bus via controllers within super I/O 30. Information regarding super I/O 30 can be obtained from, e.g., National Semiconductor Corp.

Coupled to southbridge 26 may be another peripheral bus, such as the I²C bus. The I²C bus is a fairly well documented peripheral bus having a recognized bus transfer protocol, similar to the ISA bus and the IDE bus. An I²C bus typically contains a serial data line and a serial clock line which make available numerous I²C devices and illustrate connectivity of those devices with the I²C bus protocol.

The input/output device, noted as reference numeral 32 thereby includes any device which can operate according to the connected bus protocol, similar to I/O device 24 which operates according to, e.g., a PCI bus protocol. The I/O device 32 serves to send or receive command, addresses, and/or data to and from computer system 10 and, according to the present implementation, to and from system memory 18.

Figure 2:
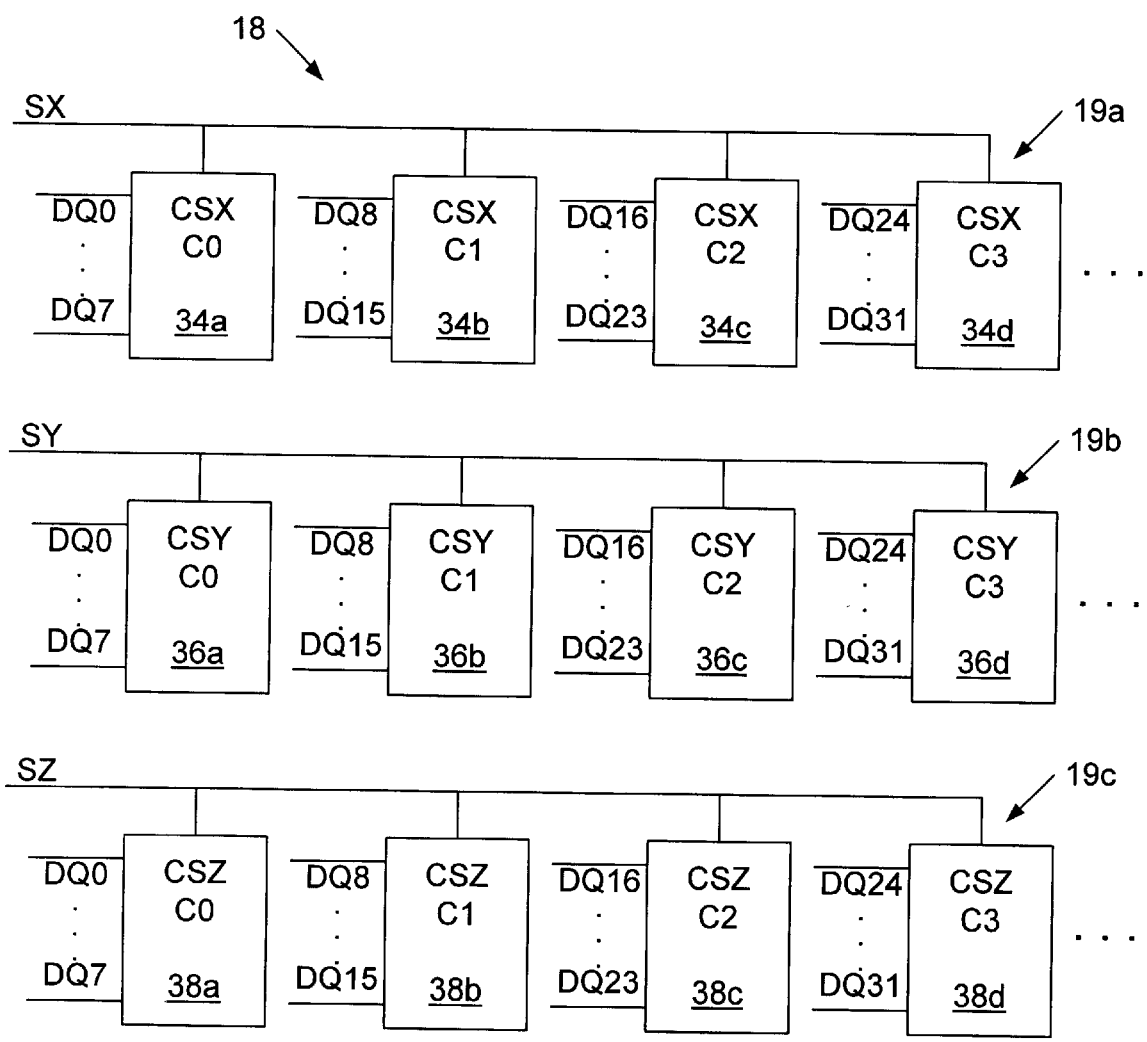
FIG. 2 is a block diagram of a partitioned SDRAM system which includes a group of data lines associated with at least one SDRAM integrated circuit, or chip, that is selectable via a chip select signal.

FIG. 2 illustrates one exemplary implementation of the partitioned SDRAM system 18. SDRAM system 18 is shown in FIG. 1 as having four partitions, and is shown in FIG. 2 has having at least three partitions 19a, 19b, and 19c. Each partition is shown having four SDRAM chips 34, 36 and 38, respectively. However, it is noted that each partition 19 need only contain one chip, depending on the desired memory bus throughput. Provided each partition contains at least one SDRAM chip, and therefore at least two internal (logical) banks of that chip, the partition can achieve seamless data flow transfer hereof.

Activation of one partition relative to the other occurs by forwarding a chip select signal to the appropriate chip. For example, activating partition 19a occurs by presenting an activation signal on the common chip select signal SX. The same applies to the other partitions 19b and 19c. If multiple chips are used within each partition, then the chip select signal is common to all chips within that partition. A benefit of linking multiple chips by a single chip select within a DIMM is particularly beneficial if data bits are desired exceeding those from a single chip. Thus, while a single SDRAM chip can currently output one or more data bits to a requester, linking multiple chips can provide whatever data width is needed, for example, linking such chips can provide multiples of 8 or 16 bits in parallel (i.e., multiples of DQ0–DQ7 or multiples of DQ0–DQ15). In the example shown, four chips can be interconnected to concurrently output 32 bits during a single system clocking cycle. By coupling eight SDRAM chips together, each of which output eight bits, an entire cache line of four quadwords can be forwarded during four system clock cycles. Accordingly, each partition can be configured as, for example, a 64 pin single or dual bank DIMM. Details regarding the data transfer characteristics and the timing of the 8, 16, or possibly 64 bit data transfer from system memory 18 is described hereinbelow.

Figure 3:
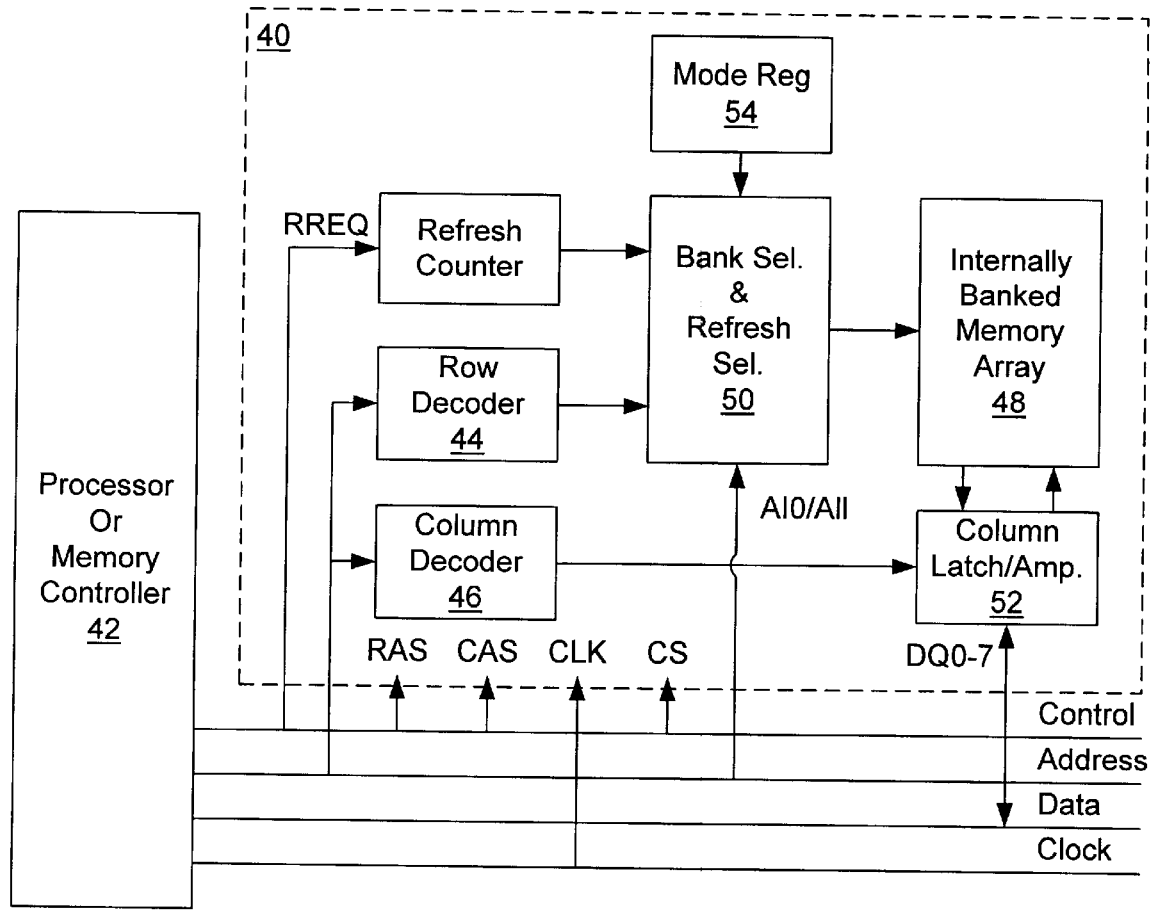
FIG. 3 is a block diagram of a single SDRAM chip employing a mechanism for refreshing at least a portion of the of the SDRAM chip during times when banks internal to the chip are deactivated.

FIG. 3 is a block diagram of various components used to illustrate operation of a single SDRAM chip 40. Chip 40 can be found within any of the various partitions 19, shown in FIGS. 1 and 2. The RAS, CAS, and CS signals are forwarded from the processor or memory controller 42 to chip 40 upon a control bus. A clocking signal forwards a sequence of clock cycles from the processor or memory controller 42 to various components within chip 40. Thus, all inputs and outputs of chip 42 are synchronized with the system clock (CLK) to simplify system design with high-speed microprocessors.

Row decoder 44 decodes an address during assertion of RAS, and column decoder 46 will decode an address during assertion of CAS. Assertion of RAS occurs during activation of a bank to which a read request will be initiated. The read request will occur several cycles later during the time in which CAS is asserted and a column address is read by column decoder 46. Depending on the status of address A11 during assertion of RAS, an internal bank within memory array 48 will be selected by a bank selector 50. Selection involves activating that particular bank so that a subsequent read cycle can occur from a column of the selected row within that bank. The read cycle is initiated on a particular column and subsequent, successive columns are read in burst fashion without having to reassert RAS. Strobing the first column within the burst sequence causes the data within the corresponding capacitor to be sensed and placed within the column latch/amplifier 52. Depending on the CAS latency, the sensed (latched) data will thereafter be placed on the data bus and transferred to the requesting device.

A mode register 54 is included with SDRAM 40, which can be programmed with a CAS latency amount, a burst type, and a burst length. Details regarding the programmable mode register are generally known to those skilled in SDRAM integrated circuits and especially to those familiar with execution of an MRS command associated with conventional SDRAM mode registers. Typically, the CAS latency, known as the delay between the read request command and the first output burst cycle, is a programmed number of minimum system clocking cycles. In most instances, the CAS latency can be programmed as one, two, or three clock cycles of the system clock.

The SDRAM array 48 typically contains two independent array banks than can be accessed individually or in an interleaved fashion. Each bank can have one row activated at any given time. This is achieved by executing a bank-activate command (ACTD) with the bank selected by the state of address terminal A11 and the specific row selected by the state of address terminals A0–A10. Each bank must be deactivated before it can be activated again with a new row address. The two-bank design allows faster access of information on random rows at a higher rate of operation than that possible with a standard DRAM. This is accomplished by activating one bank with a row address as described previously, then while the data stream is being accessed to/from that bank, the other bank is activated with another row address. Accordingly, a read request of the other bank can occur while the first bank data transfer occurs. When the data stream to or from the first bank is complete, the data stream to or from the second bank commences without interruption, i.e., is "seamless". Operations can continue in this interleaved ping-pong fashion. The mechanism for activating and deactivating a bank is generally known and set forth in numerous SDRAM specifications, such as the technical reference for Texas Instruments, Part No. TMS626162 (herein incorporated by reference).

Either a single bank or both banks can be deactivated, or placed in a pre-charge mode where deactivation of the banks is dependent on the status of the address A10 terminal. The chip select, CS, attributed to each SDRAM chip is used to select or deselect that chip for command entry. The chip select input therefore provides a means for using multiple SDRAM chips in SDRAM systems that require multiple memory device decoding. Details regarding a seamless read among multiple partitions operable from the chip select signal are set forth in the timing diagram of FIG. 4.

Figure 4:
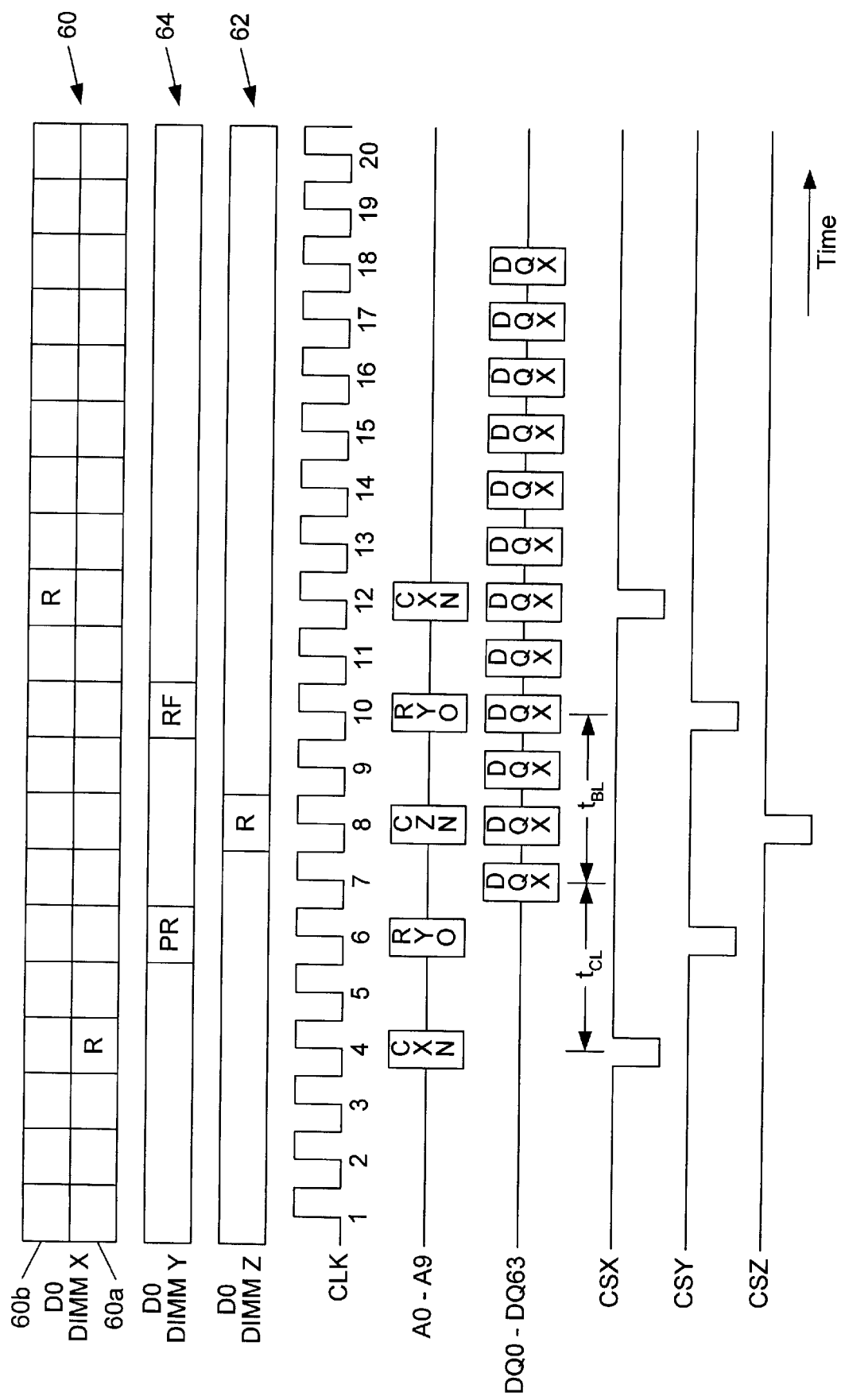
FIG. 4 is a timing diagram of a hidden refresh performed on one partition of the SDRAM system while the data transfer among the other partitions occurs in consecutive, seamless SDRAM clock cycles.

FIG. 4 illustrates three partitions, a first partition transaction diagram 60, a second partition transaction diagram 62, and a third partition transaction diagram 64. Each partition can comprise at least one SDRAM chip, having a pair of internal, or logical, banks. In the example shown, internal banks of partition 60 are shown; however, banks for the other partitions are not shown for sake of drawing brevity and clarity. In the example provided, only three partitions are shown, wherein the first partition initiates a first read request cycle, followed by a read request within the second partition, and then followed by a read request again in the first partition (albeit in another internal bank of that partition). The example illustrates three consecutive fetches from the partitioned SDRAM system, beginning with an activation operation occurring at the first system clock cycle activation operation, or command. It is assumed that all three partitions have been activated by an appropriately timed activate command prior to the respective read request commands. The result of activation operation is to select a particular bank 60a of partition 60. Assuming the activation command to the first bank 60a from the first partition pre-exists the read request command, a chip select signal will be sent to the SDRAM chip or chips within the first partition, as noted by the assertion of CSX at clocking cycle 4. While not shown, activation is triggered from the status of address A11 and a row address on the memory address bus A0–A9. The read request "R" on bank 60a is triggered at the first column address on the address bus A0–A9, indicated by column CXN, denoted as column N of the first partition X.

After a CAS latency has expired, $t_{CL}$, data appears upon the data bus, wherein the first cycle of data is denoted as DQX, attributed to data of the first read request within the first partition X. In the interim between the read request of the first partition and data thereafter being transmitted, the second partition (Z) can be activated and the third partition (Y) deactivated. Activation of the second partition is shown by reference numeral A attributed to, for example, DIMM Z or partition Z. A pre-charge command can be issued to the third partition 64 in the interim between the read request of partition 60 and the data transfer resulting from that read request. The pre-charge command is shown as PR of third partition 64. Proper timing of the activation command of the second partition 62 is not dependent on timing of the pre-charge command of the third partition 64. Specifically, the read request resulting from the activation command of the second partition occurs approximately four clock cycles after the first partition read request. Thus, the first partition read request is shown as occurring on the fourth clocking cycle, and the read request of the second partition is shown to occur on the eighth clocking cycle. Thus, the third partition read request is concurrent with the chip select of the Z (second) partition, and is concurrent with the starting column address CSN forwarded to that partition.

The starting address CXN results in a burst length of four cycles of data being read from the SDRAM system according to the illustrated example, as shown by the time delay attributed to that bit line transfer (or $t_{BL}$). The data output as a result of the second read request within the third partition begins after a CAS latency has expired, and is also four clocking cycles long indicating a burst length of four (DQZ) at time slots 11–14. A third read request initiated within bank 60b of first partition 60 occurs consistent with the timing of an initial column address CXN. Column CXN associated with the third read request can be the same column or a different column as that associated with the first read request. Again, the third read request corresponds with a chip select of the first partition, as noted by activation of CSX at time slot 12. After a CAS latency has expired, data attributed to the third read request is transferred as DQX.

An important aspect of the pre-charge and refresh operations of the third partition is to ensure those operations do not occur sequentially between a pair of read requests on other partitions separate from the partition undergoing pre-charge or refresh. More specifically, a read request of another partition is advantageously interposed between the pre-charge and refresh commands of the third partition. In this example, a read request on the second partition occurs at time slot 8 between the pre-charge at time slot 5 and the refresh at time slot 10. In this manner, the refresh at time slot 10 must occur within a four time slot differential between the second read request at time slot 8 and the third read request at time slot 12 or, alternatively, the refresh can occur between the first read request at time slot 4 and the second read request at time slot 8 (provided the pre-charge operation before time slot 4, and does not exist at any time slot between time slots 4 and 8).

By appropriately spacing the read requests N time slots apart, where N equals the burst length, data transfer of one burst is seamless with data transfer of another burst. More particularly, as soon as the last transfer of a burst occurs, data of the next burst occurs on the immediately succeeding time slot. In this fashion, there are no clocking cycles between data bursts which do not transfer data. In the example shown, there are no spaces, gaps, or "seams" between bursts of data, and that 12 data transfer cycles can occur in immediate succession to achieve three consecutive fetches from the SDRAM system.

If each partition is configured as a DIMM with 64-bit output, then each time slot can transfer up to 64 bits of data, or one cache line of four quad words can be transferred in four time slots. In this example, 12 clocking cycles (beginning on the first data burst transfer DQX) can transmit 3 cache lines or 12 quadwords of data, wherein a conventional refresh methodology would require more than 12 clocking cycles. Accordingly, the present transfer mechanism employs a hidden refresh technique whereby refresh occurs without any latency on the data transfer and therefore without requiring a hold, interrupt, or stall on the multiple burst requesting device.

Various modifications and changes may be made as would be obvious to a person skilled in the art having the benefit of this disclosure. For example, the SDRAM system may employ various number of partitions, and the partitions may be configured as a physical bank of rows, a single SDRAM chip, or a plurality of SDRAM chips interconnected through a common chip select signal. If the SDRAM system employs only two partitions, i.e., DIMM partitions X and Y, then in the example shown in FIG. 4, at clock 4 a read request occurs in partition X. At clock 6 a pre-charge can still occur and at clock 10 occurs, and the refresh of partition Y would still be hidden during the bursts occurring between read requests of partition X (i.e., between clocks 4 and 12). Thus, if the burst of data is long enough (e.g., 8 clock cycles as shown in partition X), then a refresh can be hidden during a single burst read of data from a single partition. In the two-partition example, partition Z is not present and a refresh of one partition (partition Y) can be placed, and hidden, between two read request commands occurring on the other partition (partition X). Thus, the present method of hiding the refresh operation is simply one which involves bursting data from other rows of memory found within a partition separate from another partition undergoing refresh. The refresh operation is maintained within a system clock cycle equal to the burst length separating read requests on a partition (or partitions) different from the partition undergoing refresh. In this manner, the memory controller can sustain uninterrupted and seamless data transfer (i.e., maximum data bandwidth) on the memory data bus. More specifically, the present hidden refresh optimizes the bandwidth on both the address/control as well as the data portions of the memory bus. The SDRAM system employing the present hidden refresh technique is one which can be extended to any dynamic random access memory which must be refreshed and operates from control signals synchronized with the processor or system clock. Such synchronous memory systems include double data rate SDRAMs ("DDR SDRAM"), SyncLink DRAM ("SLDRAM"), and Rambus DRAM ("RDRAM"). It is intended that the following claims be interpreted to embrace all such modifications and changes and, accordingly, the specification and drawings are to be regarded in an illustrative rather than a restrictive sense.

What is claimed is:

1. A computer system, comprising:
   a display; and
   a partitioned, synchronous DRAM system operably coupled to the display, wherein a first one of said partitions is adapted to receive a read request N number of cycles after a second one of said partitions receives a read request for dispatching N cycles of data to the display, and wherein a third one of said partitions initiates and concludes a refresh operation between the time in which the first and second ones of said partitions receives corresponding read requests.

2. The computer system as recited in claim 1, wherein the display comprises an output device configured to present visually detectable indicia thereon.

3. The computer system as recited in claim 1, wherein the first, second and third partitions each comprise at least one synchronous DRAM integrated circuit.

4. The computer system as recited in claim 1, wherein the first, second and third partitions each comprise a grouping of synchronous DRAM integrated circuits commonly linked by a chip select signal.

5. The computer system as recited in claim 4, wherein the grouping of synchronous DRAM integrated circuits comprises a dual in-line memory module (DIMM).

6. The computer system as recited in claim 4, wherein the grouping of synchronous DRAM integrated circuits within the second partition comprise a plurality of data lines adapted to concurrently output a quad word of data to the display.

7. The synchronous DRAM system as recited in claim 1, wherein the number of clocking cycles in the interim between the second read request and the third read request is not greater than four.

8. The synchronous DRAM system as recited in claim 1, wherein the data burst associated with the first, second and third read requests occurs within an unbroken sequence of 3N clocking cycles.

9. The synchronous DRAM system as recited in claim 8, wherein four quad words of data is transferred during each of the 3N clocking cycles.

10. A synchronous DRAM system, comprising:
    a clocking circuit coupled to produce a sequence of clocking cycles;
    a first set of synchronous DRAM integrated circuits coupled to the clocking circuit for reading a data burst of N clocking cycles initiated from a first read request;
    a second set of synchronous DRAM integrated circuits coupled to the clocking circuit for reading a data burst of N clocking cycles initiated from a second read request that occurs N clocking cycles after the first read request, wherein the first set of synchronous DRAM integrated circuits is further coupled to read a data burst of N clocking cycles initiated from a third read request that occurs N clocking cycles after the second read request; and a third set of synchronous DRAM integrated circuits coupled to initiate and culminate a sequence of refresh cycles in the interim between the second read request and the third read request.

11. The synchronous DRAM system as recited in claim 10, wherein the N clocking cycles comprise a data burst length N of approximately four.

12. The synchronous DRAM system as recited in claim 10, wherein the sequence of refresh cycles are dispatched from a refresh counter to a plurality of rows within a memory array of the third set of synchronous DRAM integrated circuits.

13. The synchronous DRAM system as recited in claim 10, wherein the third set of synchronous DRAM integrated circuits are coupled to pre-charge a plurality of rows within a memory array of the third set of synchronous DRAM integrated circuits in the interim between the first read request and the second read request.

14. The synchronous DRAM system as recited in claim 10, wherein the data read during each of the N clocking cycles initiated from the first and second set of synchronous DRAM integrated circuits comprises four quad words, or 256 bits.

15. The synchronous DRAM system as recited in claim 14 wherein the number of clocking cycles in the interim between the first read request and the third read request is not greater than eight.

16. A method for transferring data from a synchronous DRAM system, comprising:

providing a plurality of successive clocking cycles to a first, second and third partition of the synchronous DRAM system;

transferring a first burst of data from the first partition;

immediately after transferring the first burst of data and absent any intervening clocking cycles, transferring a second burst of data from the second partition; and while refreshing a portion of the third partition, transferring a third burst of data from the first partition immediately after transferring the second burst of data and absent any clocking cycles in the interim between transferring the second burst of data and the third burst of data.

17. The method as recited in claim 16, wherein the first, second and third bursts of data are each N clocking cycles.

18. The method as recited in claim 16, wherein each of said transferring the first, second and third bursts of data comprises concurrently fetching a cache line of data from the synchronous DRAM system.

19. The method as recited in claim 16, wherein said refreshing comprises accessing a sequence of rows within an array of the third partition during said transferring of the first burst of data.

20. The method as recited in claim 16, wherein said refreshing comprises deactivating the third portion during said transferring of the first burst of data.

* * * * *